United States Patent [19]

Ward et al.

[11] 4,121,981
[45] Oct. 24, 1978

[54] ELECTROCHEMICAL METHOD FOR FORMING A SELENIUM-TELLURIUM LAYER IN A PHOTORECEPTOR

[75] Inventors: Anthony T. Ward, Webster; James M. Ishler, Ontario, both of N.Y.; Aleksandar Damjanovic, Morristown, N.J.

[73] Assignee: Xerox Corporation, Stamford, Conn.

[21] Appl. No.: 836,124

[22] Filed: Sep. 23, 1977

[51] Int. Cl.[2] .......................... C25D 5/48; G03G 5/04
[52] U.S. Cl. .............................. 204/38 R; 204/56 R; 96/1.5 R
[58] Field of Search ............... 204/38 R, 56 R; 96/1.5

[56] References Cited

U.S. PATENT DOCUMENTS

| 3,174,855 | 3/1965 | Gray | 96/1.5 |
| 4,001,014 | 1/1977 | Ando et al. | 96/1.5 |

FOREIGN PATENT DOCUMENTS 275,633  10/1970  U.S.S.R. ............................. 204/56 R

*Primary Examiner*—John H. Mack
*Assistant Examiner*—William Leader
*Attorney, Agent, or Firm*—James J. Ralabate; James P. O'Sullivan; Gaetano D. Maccarone

[57] ABSTRACT

There is described a novel method for forming a photoreceptor which includes a photogenerator layer comprising selenium and tellurium. According to the method, the photogenerator layer is formed by electrochemically codepositing selenium and tellurium onto a substrate from a solution of their ions in such a way that the relative amounts of selenium and tellurium which are deposited are controlled by their relative concentrations in the electrolyte and by the choice of electrochemical conditions, i.e., current density or electrode potential. Subsequently a layer of a material capable of transporting at least one species of charge carrier is deposited on the free surface of the photogenerator layer by any suitable technique.

5 Claims, 2 Drawing Figures

ELECTROCHEMICAL METHOD FOR FORMING A SELENIUM-TELLURIUM LAYER IN A PHOTORECEPTOR

BACKGROUND OF THE INVENTION

This invention is directed to a photoreceptor for use in electrophotography and, more particularly, to an electrochemical method for forming a layer including selenium and tellurium in a photoreceptor.

The formation and development of images on the imaging surfaces of photoconductive materials by electrostatic means is well known. The best known of the commercial processes, more commonly known as xerography, involves forming an electrostatic latent image on the imaging surface of an imaging member by first uniformly electrostatically charging the surface of the imaging layer in the dark and then exposing this electrostatically charged surface to an imagewise pattern of activating electromagnetic radiation. The light-struck areas of the imaging layer are thus rendered relatively conductive and the electrostatic charge selectively dissipated in these irradiated areas. After the photoconductor is exposed, the electrostatic latent image on this image bearing surface is typically rendered visible with a finely divided colored marking material, known in the art as "toner". This toner will be principally attracted to those areas on the image bearing surface which retain the electrostatic charge and thus form a visible powder image. The electrostatic latent image may also be used in a host of other ways as, for example, electrostatic scanning systems may be employed to "read" the latent image or the latent image may be transferred to other materials by TESI techniques and stored. A developed image can then be read or permanently affixed to the photoconductor where the imaging layer is not to be reused.

In the commercial "plain paper" copying systems, the latent image is typically developed on the surface of a reusable imaging member, subsequently transferred to a sheet of paper and then permanently affixed thereto to form a permanent reproduction of the original object. The imaging surface of the member is cleaned of any residual toner and additional reproductions of the same or other original objects can be made thereon.

There are known in the art photoreceptor configurations wherein the functions of absorption of imaging radiation and the generation of charge carriers on the one hand and charge carrier transport on the other are carried out primarily by means of separate but contiguous layers. It is also known in the art to employ alloys of selenium and tellurium as the photoconductive insulating layer in a photoreceptor.

In well established technical fields such as xerography, new techniques are often proposed for the formation of articles used therein. The present invention is directed to a method for forming a photoreceptor wherein the photogenerator layer includes selenium and tellurium and is formed by an electrochemical technique.

PRIOR ART STATEMENT

Chemical Abstracts, Vol. 62, 1965, 10067 h refers to an article wherein selenium and tellurium were deposited from nonaqueous solutions.

SUMMARY OF THE INVENTION

It is the object of this invention to provide a method for forming a photoreceptor which includes a photogenerator layer and a layer of a material which is capable of transporting at least one species of charge carrier.

It is another object to provide an electrochemical method for forming a photogenerator layer comprising selenium and tellurium.

It is a further object to provide an economical method for the continuous fabrication of a layer comprising selenium and tellurium with controlled stoichiometry and thickness.

It is still another object to form a photogenerator layer by codepositing selenium and tellurium from a solution of their ions so that the relative amounts of selenium and tellurium are controlled by their relative concentrations in the electrolyte and by the choice of electrochemical conditions.

Yet another object is to form a photogenerator layer by codepositing selenium and tellurium from an electrolyte such that tellurium deposits under limiting current conditions.

BRIEF SUMMARY OF THE INVENTION

These and other objects and advantages are accomplished in accordance with the invention by providing a novel method for forming a photoreceptor which includes a photogenerator layer comprising selenium and tellurium. According to the method the photogenerator layer is formed by electrochemically codepositing selenium and tellurium onto a substrate from a solution of their ions such that the relative amounts of the two materials in the layer are controlled by their relative concentrations in the electrolyte and by the choice of electrochemical conditions, i.e., current density or potential. Subsequently a layer of a material capable of transporting at least one species of charge carrier is deposited on the free surface of the photogenerator layer.

BRIEF DESCRIPTION OF THE DRAWINGS

For a better understanding of the invention as well as other objects and features thereof, reference is made to the following detailed description of various preferred embodiments thereof taken in conjunction with the accompanying drawings wherein.

DESCRIPTION OF THE PREFERRED EMBODIMENTS

Figure 1:
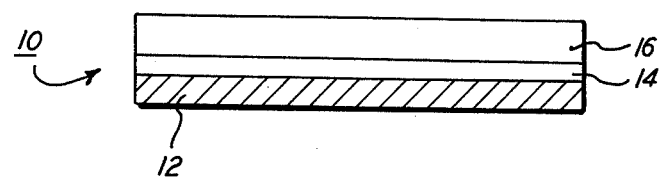
FIG. 1 is a partially schematic, cross-sectional view of a photoreceptor according to the invention.

Referring now to FIG. 1 there is illustrated a photoreceptor, generally designated 10, formed according to the invention comprising a conductive substrate 12, a photogenerator layer comprising selenium and tellurium 14 and a layer of a material which is capable of transporting at least one species of charge carrier 16. The seleniumtellurium photogenerator layer 14 is formed on the substrate 12 by placing the latter in an electrodeposition cell such as that illustrated in FIG. 2 (which may be a cylindrical pyrex cell) as the cathode 18. The cell is closed at the other end by a conductive member which acts as the anode 20.

The cell is filled with an electrolyte which includes ions of selenium and tellurium. The electrolyte can be prepared by dissolving tellurium dioxide in a minimum volume of conc. hydrochloric acid and diluting with triply distilled water to form a solution that typically is from about 0.01M $Te^{iv}$ and about 0.1M HCl to about 0.0025M $Te^{iv}$ and about 0.025M HCl. Selenium dioxide is then added to form a solution which is from about 0.1M $Se^{iv}$ to about 10M $Se^{iv}$. when the $Te^{iv}$ concentration is in the range specified, the preferred concentration for $Se^{iv}$ is 0.1M.

The conducting substrate 12 may comprise any material which will provide a good blocking contact with selenium alloys. Typical suitable substrates include, for example, gold, platinum and NESA glass, a tin-oxide coated glass. These materials are preferred because they form good blocking contacts with selenium alloys without deliberate provision of a separate barrier layer and are resistant to the acid medium of the electrolyte.

Initially the cell is deoxygenated by purging with inert gas prior to the deposition step in order to remove dissolved oxygen initially present. Purging is sustained during deposition of selenium and tellurium in order to remove oxygen and chlorine generated at the anode rather than allowing these to be reduced in a competitive reaction at the cathode. Passage of a constant current supplied by a D.C. energy source 22 through the electrolyte causes reduction of $Se^{iv}$ and $Te^{iv}$ to form an amorphous selenium and tellurium alloy at the cathode 18 and oxidation of water and chloride ion to gaseous oxygen and chlorine respectively at the anode 20. Typically an approximately 1000 Å to approximately 3000 Å thick film of the selenium-tellurium alloy can be deposited using a current in the range of from about $1.5 \times 10^{-4}$ A/cm$^2$ to about $5 \times 10^{-4}$ A/cm$^2$ for about 28 minutes.

For the type of photoreceptors formed according to the invention, i.e., where the selenium-tellurium layer is the primary source of photogenerated charge carriers, it is preferred that the tellurium concentration in the layer be from about 5 atomic percent to about 17 atomic percent and optimally on the order of about 10 atomic percent. Hence, to ensure preferential deposition of selenium during the codeposition of selenium and tellurium from the electrolyte it is necessary that the current density and concentration of selenium and tellurium in the electrolyte be selected so that tellurium deposits under limiting current conditions, i.e., the current density for deposition of tellurium, is limited by the arrival of tellurium-containing ions at the cathode. With the amount of tellurium depositing on the cathode fixed in this manner the amount of selenium codepositing on the cathode can be increased at will by increasing the total applied current density and/or the selenium concentration in the electrolyte.

When the $Te^{iv}$ concentration is in the range of from about 0.0025M to about 0.01M and the $Se^{iv}$ concentration is about 0.1M or greater, the current density supplied by the reduction of $Te^{iv}$ appears to be in the range of from about $10^{-5}$ A/cm$^2$ to about $5 \times 10^{-5}$ A/cm$^2$. Thus, when the total applied current density is in the range from about $1.5 \times 10^{-4}$ A/cm$^2$ to about $5 \times 10^{-4}$ A/cm$^2$ the number of Te atoms deposited can, in principle, range from a low of around 2 per 100 atoms of Se to a high of around 30 per 100 atoms of Se. Typically it is desired to deposit from about 5 to about 17 atoms of Te per 100 atoms of Se.

After the selenium-tellurium layer deposited on the cathode has reached the desired thickness, deposition substantially ceases upon inactivation of the driving force of the cell. The cathode is then removed from the cell and the selenium-tellurium layer is washed and dried, preferably in a vacuum oven. It should be noted here that prolonged ambient exposure of the Se-Te layer may result in surface crystallization particularly when the layer contains more than about 10 atomic percent Te. The Se-Te layer surface may be protected against crystallization by ensuring that the final stages of deposition involve the reduction of $Se^{iv}$ ions only. In this case, the surface of the layer may consist of pure selenium or a selenium-tellurium alloy which is rich enough in selenium so that crystallization is essentially prevented. The selenium-rich surface layer may be produced by two techniques. According to one, the current density is increased to a point where the diffusion limited deposition rate for $Te^{iv}$ becomes insignificant compared with that for $Se^{iv}$. Alternatively the electrolyte containing $Se^{iv}$ and $Te^{iv}$ can be flushed from the cell and replaced with an electrolyte containing only $Se^{iv}$, for example, 0.1M selenious acid acidifed to a pH of 2 with dilute sulfuric acid. In the latter case, resumption of electrolysis with the new electrolyte results in the deposition of a protective surface layer of amorphous selenium on top of the selenium-tellurium layer already present at the cathode.

The selenium-tellurium layer is then overcoated with a layer of a charge carrier transport material which is capable of transporting at least one species of charge carrier. This can be done by any suitable method such as, for example, by dip coating from a solution of the transport material or by a draw bar coating technique. The charge carrier transport material layer 16 typically has a thickness of from about 3 to about 20 microns. Any suitable charge carrier transport material may be used. Typical suitable transport material include, for example, poly(N-vinylcarbazole), poly(vinylpyrene), poly(vinylnaphthalene), poly(2-vinylanthracene) and poly(9-vinylanthracene). A charge carrier transport matrix may also be formed by combining one or more electronically inert polymers such as poly(vinylchloride) with one or more of the above-named transport materials. The method of combination of such electronically distinct polymers can include copolymerization (random, graft, block, etc.,), formation of an interpenetrating polymer network and polymer blending. Alternatively an electronically inert polymer matrix can be rendered an efficient transporter of charge carriers by the incorporation within a film of such materials so-called "small molecules" capable of an efficient carrier transport. The term "small molecules" is inclusive of single molecules and low molecular weight polymers. These small molecules can be added to the casting or coating solution during formation of the polymeric matrix or can be subsequently introduced into the matrix by swelling of the polymeric materials of the matrix with a solution containing the small molecule compounds. Upon evaporation of the liquid phase of the solution, the small molecules will remain entrapped within the polymeric matrix thus enhancing charge carrier transport properties of this insulating film. These small molecules can also be added to active polymeric matrices in order to enhance the transport of charge carriers not readily transported by the electronically active polymer. For example, Lewis Acid can be added to a photoconductive polymer such as poly(N-vinylcarbazole) in order to improve electron transport. Representative of small molecule additives, which can be added to either an electronically active or inert polymer matrix to facilitate hole (+) transport include pyrene, anthracene, carbazole, triphenylamine, naphthalene, julolidine, indole and perylene. Small molecule additives, which can be incorporated into either an electronically active or inert polymer matrix to facilitate electron (−) transport include anthracene, fluorenone, 9-dicyanomethylene-fluorene, the nitro derivatives of fluorenone, the nitro derivatives of 9-dicyanomethylene-fluorene and chloranil. Both hole and electron small molecule transport materials can be used in combination with one another in inert polymers. A number of the above small molecules are known to form charge transfer complexes with both the inert and active polymer systems and some absorption by the matrix complex is permitted provided that the absorptivity of the resulting charge transfer complex does not compete with the selenium-tellurium layer since it is desired that the selenium-tellurium layer be the primary source of photogenerated charge carriers for the photoreceptor in the imaging method. Hence, the charge carrier transport layer is preferably substantially non-photosensitive to the radiation employed to expose the photoreceptor during imaging which is typically visible light.

The photoreceptor 10 formed according to the method of the invention is substantially panchromatic and can be utilized to form reproductions of original objects according to well known electrophotographic imaging methods. The photoreceptor is electrostatically charged, exposed to an imagewise pattern of activating electromagnetic radiation to form an electrostatic latent image and then contacted with a developer material to form a visible image which is typically transferred to a permanent receiver member and fixed thereto. The photoreceptor may then be cleaned to remove any residual developer material and used to form additional reproductions. The polarity of the electrostatic charge applied to the photoreceptor depends upon the nature of the charge carrier transport material. If the transport material is a hole transport material then the charging step is carried out with negative polarity whereas a positive polarity charge is used when the transport material transports electrons. Of course if the transport material is capable of transporting either species of charge carrier, then the charging step may be of either polarity.

The invention will now be further described in detail with respect to specific preferred embodiments by way of Examples, it being understood that these are intended to be illustrative only and the invention is not limited to the materials, conditions, process parameters, etc., recited therein. All percentages recited are by weight unless otherwise specified.

EXAMPLE I

Figure 2:
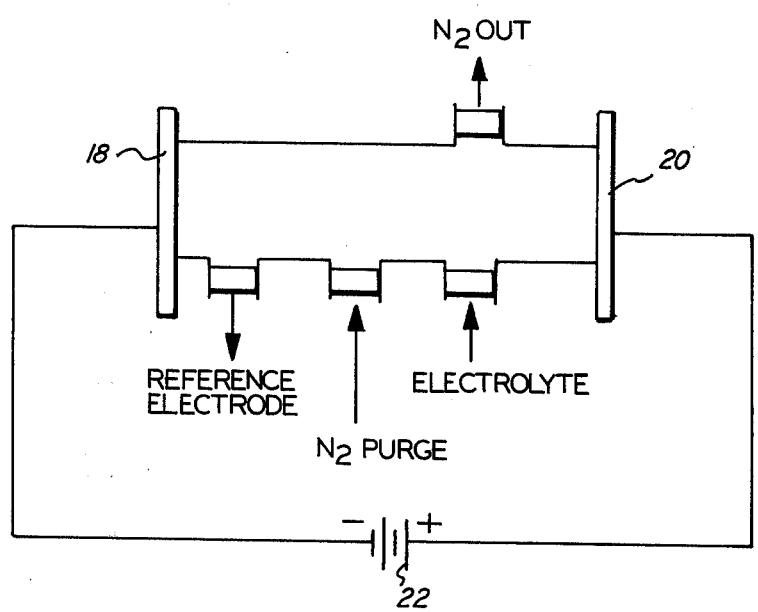
FIG. 2 is a schematic representation of an electrodeposition cell.

A solution is prepared by dissolving tellurium dioxide in a minimum volume of conc. hydrochloric acid and then diluting the solution to 0.0025M Te and 0.025M HCl. Subsequently the solution is made 0.1M in selenious acid by adding selenium dioxide. An electrodeposition cell such as that illustrated in FIG. 2 is set up with NESA glass (tin-oxide coated glass) plates as the anode and cathode. The electrolyte is added to the cell and the cell and electrolyte are then deoxygenated with nitrogen in situ. The active area of the electrodes is about 20 cm$^2$. The electrolyte is then electrolyzed at a constant current density of about $5 \times 10^{-4}$ A/cm$^2$ for about twenty-eight minutes. The spectral response of the selenium-tellurium layer as measured under electrochemical conditions, is more panchromatic than that for selenium alone.

After deposition is completed the cathode is removed from the electrolyte, washed with triply distilled water and methanol and dried. The selenium-tellurium layer is then overcoated with an approximately 6 micron thick poly(N-vinylcarbazole) layer by draw bar coating a solution of poly(N-vinylcarbazole) in tetrahydrofuran. The member is dried in vacuum at room temperature.

EXAMPLE II

The procedure of Example I is repeated with the exception that the electrolyte is 0.01M Te and 0.1M HCl and the electrolyte is electrolyzed at a constant current density of about $1.5 \times 10^{-4}$ A/cm$^2$ for about 28 minutes.

EXAMPLE III

The procedure of Example I is repeated with the exception that the electrolyte is 0.01M Te and 0.1M HCl.

EXAMPLE IV

The procedure of Example III is repeated except that after deposition of the selenium-tellurium layer, the electrolyte is removed and the cell rinsed. Subsequently a new electrolyte containing only Se$^{iv}$ is placed in the cell and electrolysis is resumed. A thin layer of amorphous selenium is deposited over the selenium-tellurium layer. Then an approximately 6 micron thick layer of poly(N-vinylcarbazole) is formed over the thin amorphous selenium layer in the manner previously described.

Although the invention has been described with respect to specific preferred embodiments, it is not intended to be limited thereto but rather those skilled in the art will recognize that variations and modifications may be made which are within the spirit of the invention and the scope of the claims.

We claim:
1. A process for forming an electrophotographic photoreceptor comprising:
   (a) providing a substrate comprising a conductive layer which is capable of forming a blocking contact with selenium;
   (b) cathodically depositing a layer of an amorphous selenium-tellurium alloy on a surface of said substrate from an aqueous electrolyte solution containing Se$^{iv}$ and Te$^{iv}$ ions whereby the portion of said alloy in contact with said surface of said substrate comprises from about 5 atomic percent to about 17 atomic percent tellurium; and
   (c) overcoating said selenium-tellurium layer with a layer of a charge carrier transport material which is capable of transporting at least one species of charge carrier.

2. The process as defined in claim 1 wherein said charge carrier transport material is an electron transport material.

3. The process as defined in claim 1 wherein said substrate comprises a member selected from the group consisting of nickel, gold and tin oxide.

4. The process as defined in claim 1 wherein said selenium-tellurium layer has an average thickness of from about 1000 Å to about 3000 Å.

5. The process as defined in claim 4 wherein the tellurium concentration in said selenium-tellurium layer is about 10 atomic percent.

* * * * *